(12) United States Patent
Cooper et al.

(10) Patent No.: US 8,343,841 B2
(45) Date of Patent: Jan. 1, 2013

(54) METHOD FOR FABRICATING A SEMICONDUCTOR DEVICE

(75) Inventors: James A. Cooper, West Lafayette, IN (US); Xiaokun Wang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 12/961,410

(22) Filed: Dec. 6, 2010

(65) Prior Publication Data

US 2011/0151649 A1    Jun. 23, 2011

Related U.S. Application Data

(62) Division of application No. 11/338,043, filed on Jan. 23, 2006, now abandoned.

(60) Provisional application No. 60/646,151, filed on Jan. 21, 2005.

(51) Int. Cl.
*H01L 21/331* (2006.01)

(52) U.S. Cl. ......... 438/309; 438/312; 438/341; 438/350

(58) Field of Classification Search .................. 438/309, 438/312, 341, 350
See application file for complete search history.

(56) References Cited

U.S. PATENT DOCUMENTS

| | | | |
|---|---|---|---|
| 2001/0032999 A1* | 10/2001 | Yoshida | 257/332 |
| 2005/0107971 A1* | 5/2005 | Ritzdorf et al. | 702/84 |
| 2005/0208691 A1* | 9/2005 | Shei et al. | 438/29 |
| 2005/0227382 A1* | 10/2005 | Hui | 438/14 |
| 2006/0154461 A1* | 7/2006 | Zhu et al. | 438/592 |

* cited by examiner

*Primary Examiner* — Jae Lee
(74) *Attorney, Agent, or Firm* — Barnes & Thornburg LLP

(57) ABSTRACT

A method for fabricating a semiconductor device includes forming a first semiconductor layer on a front side of the semiconductor substrate. Additional semiconductor layers may be formed on a font side of the first semiconductor layer. The substrate is subsequently removed. In some embodiments, one or more additional semiconductor layers may be formed on the back side of the first semiconductor layer after the semiconductor substrate has been removed. Additionally, in some embodiments, a portion of the first semiconductor layer is removed along with the semiconductor substrate. In such embodiments, the first semiconductor layer is subsequently etched to a known thickness. Source regions and device electrodes may be then be formed.

18 Claims, 15 Drawing Sheets

METHOD FOR FABRICATING A SEMICONDUCTOR DEVICE

RELATED APPLICATIONS

This patent application is a divisional of U.S. application Ser. No. 11/338,043, entitled "Method For Fabricating A Semiconductor Device" and filed Jan. 23, 2006, which claims the benefit of U.S. Provisional Application No. 60/646,151, entitled "High-Voltage N-Channel Insulated Gate Bipolar Transistor (IGBT) in Silicon Carbide" and filed Jan. 21, 2005. Each of the foregoing applications is expressly incorporated herein by reference in its entirety.

GOVERNMENT RIGHTS

This invention was made with support from DARPA/MTO Grant No. N00014-02-1-0628; the government may have certain rights in this invention.

TECHNICAL FIELD

The present disclosure relates generally to methods for fabricating semiconductor devices, and more particularly to methods for fabricating high-power semiconductor devices.

BACKGROUND

High-power semiconductor devices, such as insulated-gate bipolar transistors, are typically fabricated on thick substrates to, for example, provide sufficient structural support for the semiconductor device during the fabrication process. In some applications, the thick substrates may present a high parasitic series resistance in the device due to carrier freeze-out and/or low hole mobility in the substrate.

SUMMARY

A method for fabricating a semiconductor device may include forming a semiconductor substrate. The semiconductor substrate may be, for example, a silicon-carbide semiconductor substrate. The method may also include forming a first semiconductor layer on a front side of the semiconductor substrate. The first semiconductor layer may be so formed by, for example, epitaxially growing the first semiconductor layer. The first semiconductor layer may be formed on either a silicon side or a carbon side of the semiconductor substrate. The first semiconductor layer may be, for example, a drift semiconductor layer. The drift semiconductor layer may have a first concentration of first type impurities that is less than a second concentration of first type impurities of the semiconductor substrate. Alternatively, the semiconductor substrate may be doped with second type impurities. The first semiconductor layer may be formed to a thickness of about one micrometer. The method also includes removing the semiconductor substrate after the formation of the first semiconductor layer. The semiconductor layer may be so removed by using, for example, a chemical mechanical polishing process. Removing the substrate may include removing a portion of the first semiconductor layer. The semiconductor device may be an insulated-gate bipolar transistor. For example, the semiconductor device may be a DMOS insulated-gate bipolar transistor or a UMOS insulated-gate bipolar transistor.

The method may also include forming a second semiconductor layer on a front side of the first semiconductor layer. The first semiconductor layer may have a first concentration of first type impurities and the second semiconductor layer may have a second concentration of second type impurities. The method may also include forming a second semiconductor layer on a back side of the first semiconductor layer after the semiconductor substrate has been removed. The first semiconductor layer may form a bottom semiconductor layer or a top semiconductor layer of the device after the semiconductor substrate has been removed. Removing the substrate may include removing a portion of the first semiconductor layer.

The method may further include determining a thickness of the first semiconductor layer subsequent to the removing step. The thickness of the first semiconductor layer may be determined, for example, by use of a trench length measure process. For example, the thickness of the first semiconductor layer may be determined, subsequent to the removing step, based on a sheet resistivity of the first semiconductor layer. Determining the thickness of the first semiconductor layer may also include extrapolating a conductivity of the first semiconductor layer to a value of about zero. The first semiconductor layer may then be etched to a known thickness based on the determined thickness.

A method for fabricating an insulated-gate bipolar transistor may include forming a semiconductor substrate. The semiconductor substrate may be, for example, a silicon-carbide semiconductor substrate. The method may also include forming a drift semiconductor layer on a front side of the semiconductor substrate. The drift semiconductor layer may be so formed by, for example, epitaxially growing the drift semiconductor layer on the semiconductor substrate. The drift semiconductor layer may be formed on a silicon side or a carbon side of the semiconductor substrate. The method also includes forming a drain layer on a front side of the drift semiconductor layer. The drift semiconductor layer may be doped with first type impurities while the drain semiconductor layer may be doped with second type impurities. The method may further include forming a first source region and a second source region in the drift semiconductor layer. The first and second source regions may be formed in the drift semiconductor layer subsequent to the removing step. The method may yet further include forming a first source contact on a front side of the first source region and a second source contact on a front side of the second source region. The method may include forming a gate oxide on a back side of the first semiconductor layer and a gate contact on a front side of the gate oxide. The method may also include forming a drain contact on a front side of the drain semiconductor layer. The method may yet further include forming an additional semiconductor layer on a back side of the drift semiconductor layer subsequent to the removing step.

A method for fabricating an insulated-gate bipolar transistor may include forming a semiconductor substrate, which may be formed from a silicon-carbide material. The method may also include forming a first semiconductor layer on a front side of the first semiconductor substrate. The method may also include forming a second semiconductor layer on a front side of the first semiconductor layer. The method may yet further include removing the semiconductor substrate and a portion of the first semiconductor layer. The method may also include forming a third semiconductor layer on a front side of the second semiconductor layer. The method may also include determining a thickness of the first semiconductor layer subsequent to the removing step. The thickness of the first semiconductor layer may be determined by, for example, use of a trench length measure technique. Additionally, the thickness of the first semiconductor layer may be determined based on a sheet resistivity of the first semiconductor layer. Determining the thickness of the first semiconductor layer subsequently to the removing step may also include extrapolating a conductivity of the first semiconductor layer to a value of about zero.

A method for fabricating a semiconductor device on a semiconductor substrate may include forming a first semiconductor layer on a front side of the semiconductor substrate. The method may also include forming a second semiconductor layer on a front side of the first semiconductor layer. The first and the second semiconductor layers may be formed from a silicon-carbide material. The method may further include removing the semiconductor substrate. Additionally, the method may yet further include processing the semiconductor device after the removing step to form an insulated-gate bipolar transistor.

The above and other features of the present disclosure, which alone or in any combination may comprise patentable subject matter, will become apparent from the following description and the attached drawings.

BRIEF DESCRIPTION OF THE DRAWINGS

The detailed description particularly refers to the following figures, in which.

DETAILED DESCRIPTION OF THE DRAWINGS

Figure 1:
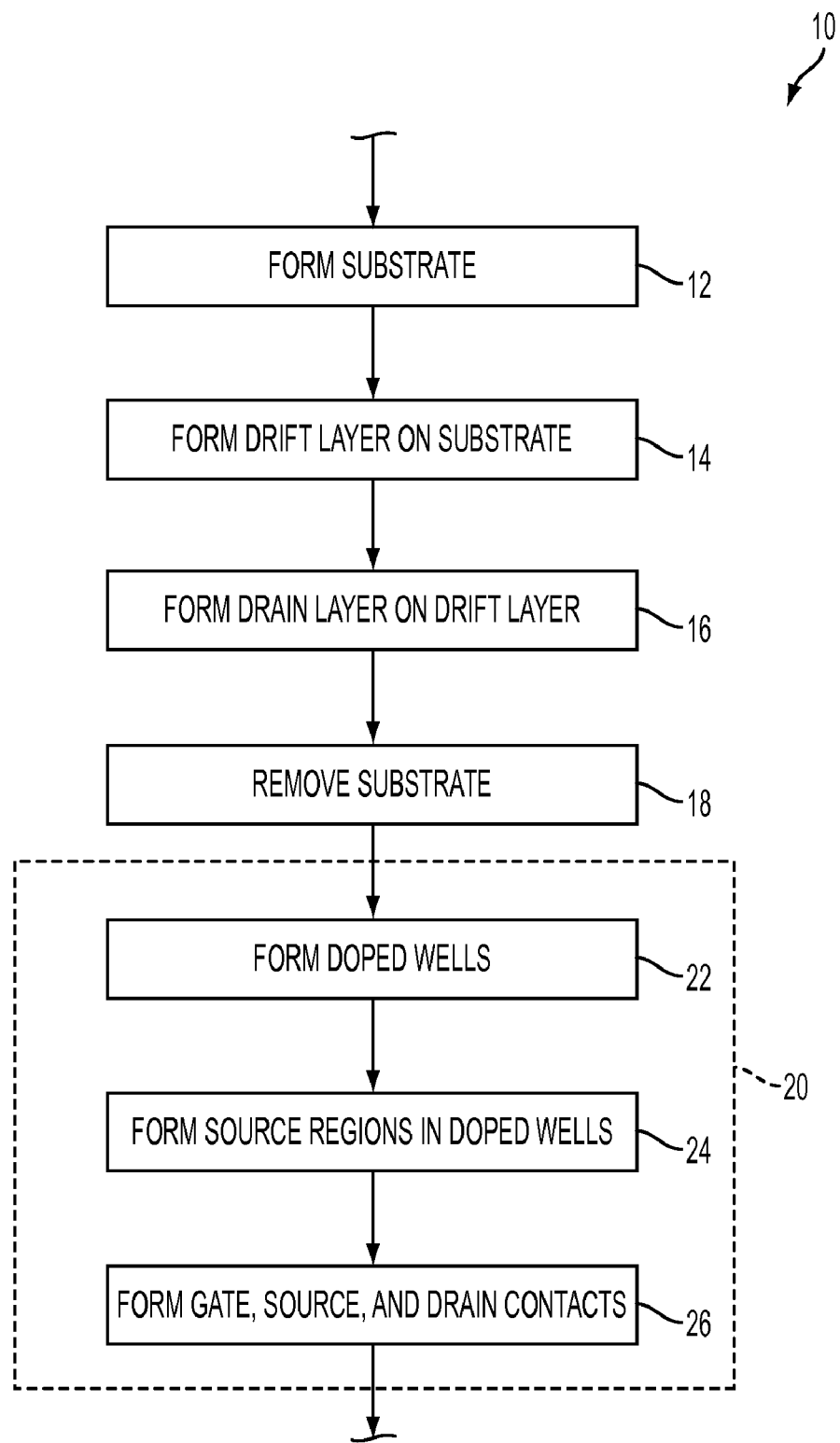
FIG. 1 is a flowchart of one embodiment of an algorithm for fabricating a semiconductor device.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Figure 2A:
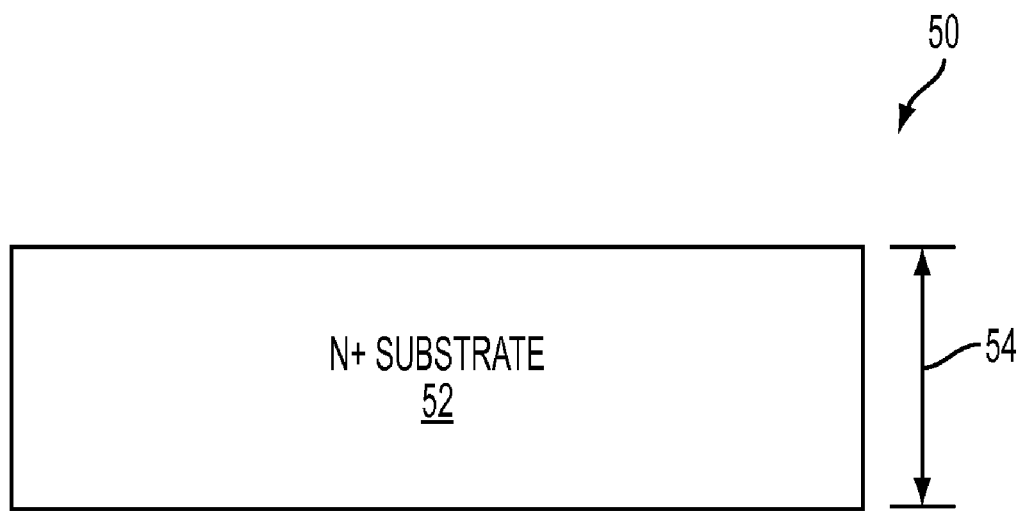
FIGS. 2a-2f are fragmentary, cross-sectional views of one embodiment of a semiconductor device at different stages of fabrication according to the algorithm of FIG. 1.
Figure 2B:
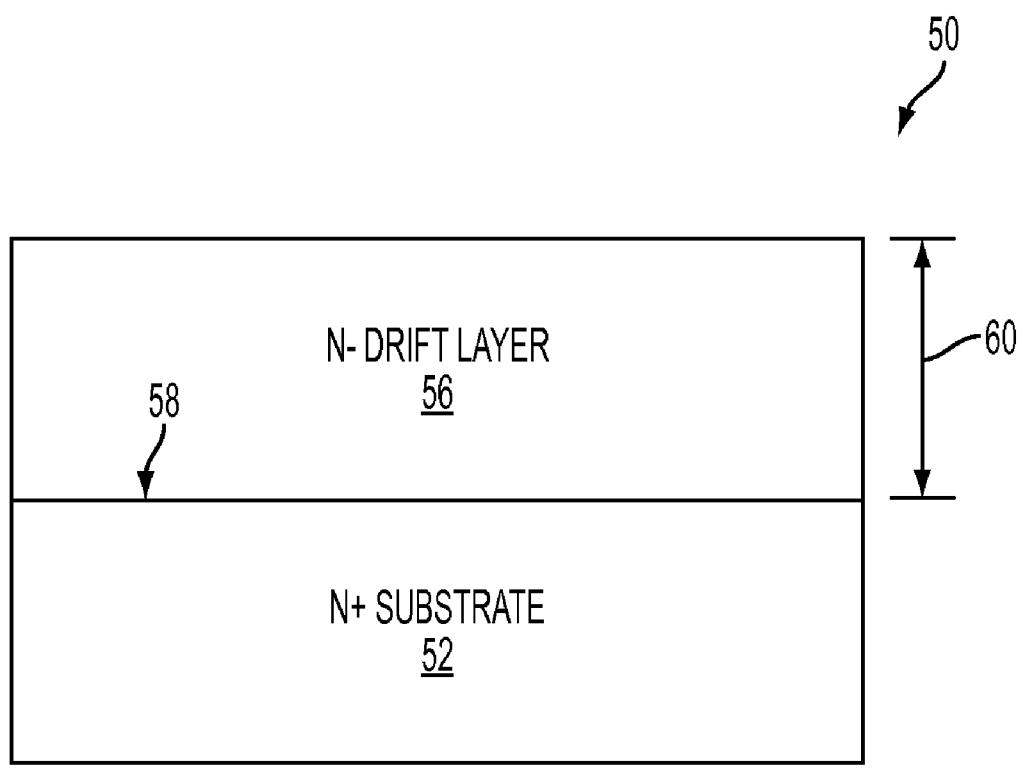
Figure 2C:
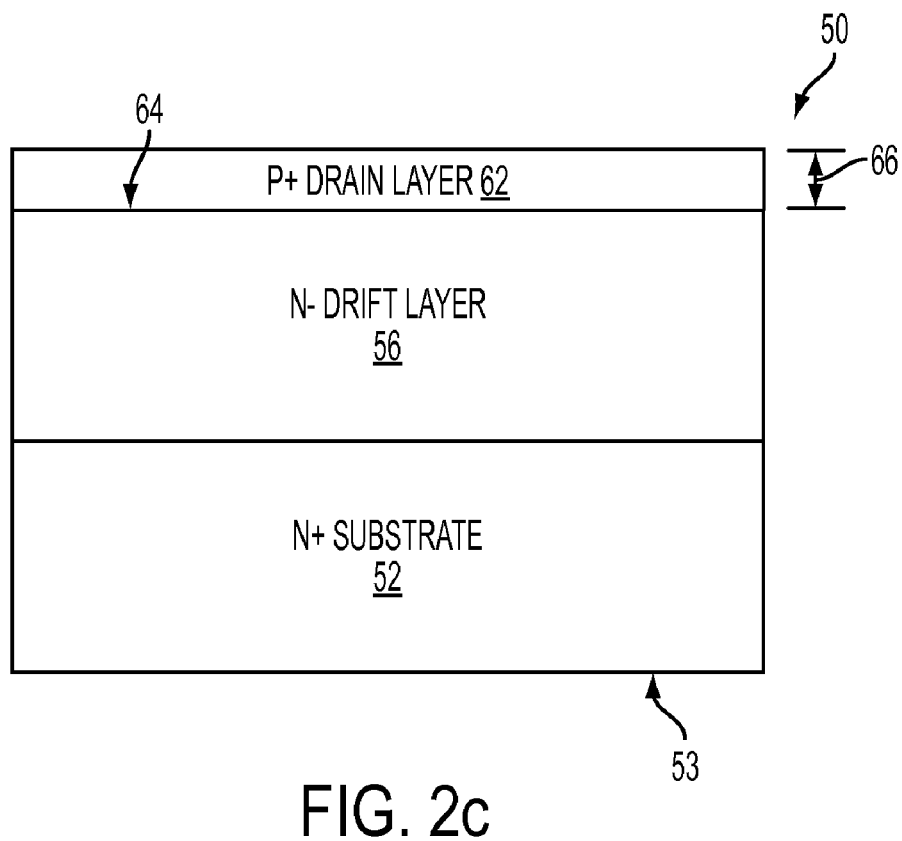

Referring to FIG. 1, according to one embodiment, an algorithm 10 for fabricating a semiconductor device 50, such as an insulated-gate bipolar transistor device, includes a first step 12 in which a semiconductor substrate 52 is formed. The substrate 52 may be formed from any semiconductor material and may be doped with N-type impurities or P-type impurities. For example, as illustrated in FIG. 2a, in one particular embodiment, the substrate 52 is formed from silicon-carbide and doped to a concentration of "N+" with N-type impurities. However, it should be appreciated that the substrate 52 may alternatively be doped to a concentration of "P+" with P-type impurities. The substrate 52 is formed to a thickness 54 sufficient to provide structural support to other semiconductor layers during subsequent fabrication steps and/or facilitate the removal thereof, as discussed in more detail below in regard to process step 18. For example, in one particular embodiment, the semiconductor substrate 52 is formed to a thickness 54 of about 350 micrometers. However, other thicknesses 54 may be used in other embodiments.

Once the substrate 52 is formed, a drift semiconductor layer 56 is formed on a front side 58 of the semiconductor substrate 52. It should be appreciated, however, that one or more "buffer layers" may also be formed between the drift semiconductor layer 56 and the semiconductor substrate 52. As such, as used herein the term "formed on a front side of the substrate/layer" is intended to mean formed on a top surface of the substrate/layer and/or formed on the front side of the substrate/layer with respect to the top surface of the substrate/layer with a number of intervening "buffer layers". Similarly, as used herein, the term "formed on a back side of the substrate/layer" is intended to mean formed on a bottom surface of the substrate/layer and/or formed on the back side of the substrate/layer with respect to the bottom surface with a number of intervening "buffer layers".

Illustratively, the drift layer 56 is formed from a silicon-carbide material, but in other embodiments, other types of semiconductor material may be used. The drift semiconductor layer 56 is doped to an "N−" concentration with N-type impurities. Additionally, the drift semiconductor layer 56 is formed to a thickness 60, the value of which is determined based on the particular application of the semiconductor device 50. For example, in high-power applications, the blocking voltage (e.g., the drain-to-source voltage at which avalanche breakdown occurs) of the semiconductor device is dependent, in part, on the thickness of the drift semiconductor layer 56. As such, for high-power applications, the semiconductor device 10 may have a drift layer 56 of a greater thickness than the drift layers of semiconductor devices for low power applications. For example, in one particular embodiment, the draft semiconductor layer 56 is formed to have a thickness 60 of about 150 micrometers to about 300 micrometers. The drift semiconductor layer 56 may be formed on the front side 58 of the semiconductor substrate 52 using any suitable semiconductor fabrication method. In one particular embodiment, the drift semiconductor layer 56 is formed on the top side 58 of the semiconductor substrate via epitaxial growth.

In embodiments wherein the semiconductor substrate 52 is formed from silicon-carbide, the semiconductor substrate 52 has a silicon side and a carbon side due to the orientation of the silicon and carbon molecules in the crystal lattice of the semiconductor wafer from which the semiconductor substrate 52 is formed. That is, a silicon-carbide wafer is sliced such that the surface of one side of the silicon-carbide wafer is formed from substantially only silicon atoms and the surface of the opposite side of the silicon-carbide wafer is formed from substantially only carbon atoms. Regardless, the drift semiconductor layer 56 may be formed on the semiconductor substrate 56 on the silicon side or the carbon side. That is, the "front side" of the silicon-carbide wafer may be determined to be the silicon side or the carbon side depending, typically, on the particular application. In one particular embodiment, the drift semiconductor layer 56 is formed on the silicon side of the semiconductor substrate.

Referring back to FIG. 1, after the drift semiconductor layer 56 has been formed, a drain semiconductor layer or anode layer 62 is formed in process step 16. The drain layer 62 is the semiconductor layer of the semiconductor device 50 that will eventually be coupled with the drain electrode, as discussed in more detail in regard to process step 26. The drain layer 62 is formed on a front side 64 of the drift semiconductor layer 56. Similar to the illustrative drift layer 56, the illustrative drain semiconductor layer 62 is formed from a silicon-carbide material. However, in other embodiments, other types of semiconductor material may be used to form the drain semiconductor layer 62. In embodiments wherein the drift layer is formed from a silicon-carbide material, the front side 64 may be the silicon side or the carbon side of the drift semiconductor layer 56. The drain semiconductor layer 62 may be formed by epitaxially growing the drain layer 62 on the front side of the draft semiconductor layer 56. Alternatively, the drain semiconductor layer 62 may be formed by ion implantation of the draft semiconductor layer 56.

The drain semiconductor layer 62 is illustratively doped to a "P+" concentration with P-type impurities. However, in other embodiments, the drain semiconductor layer 62 may be doped to other concentrations of other types of impurities. The drain semiconductor layer 56 is formed to have a small thickness 66 with respect to semiconductor substrates of typical high-power semiconductor devices such as typical high-power insulated-gate bipolar transistor device. Such a thin drain layer 62 may reduce the parasitic series resistance of the semiconductor device compared to typical high-power semiconductor devices with thick drain layers.

Figure 2D:
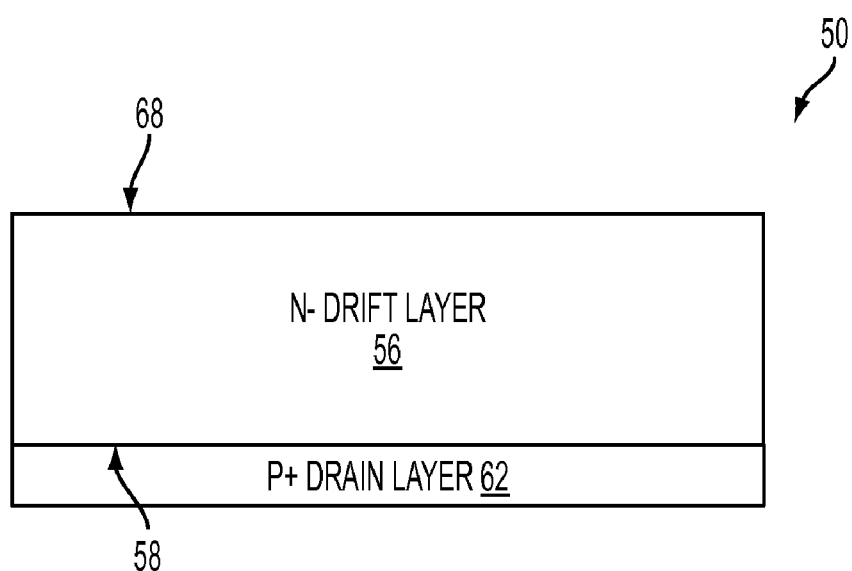

Referring back to FIG. 1, once the drain layer 62 has been formed in process step 16, the semiconductor substrate 52 is removed from the semiconductor device 50 in process step 18. To do so, the semiconductor device 50 may be flipped over such that the back side 53 of the semiconductor substrate 52 is accessible. The semiconductor substrate 52 may be removed from the semiconductor device 50 using any one of a number of removal techniques. In one particular embodiment, the semiconductor substrate 52 is removed from the semiconductor device 50 using a chemical mechanical polish (CMP) process. As illustrated in FIG. 2d, once the semiconductor substrate 52 has been removed from the semiconductor device 50, a back side 68 of the drift layer 56 is accessible. The back side 68 is subsequently cleaned and any damage is repaired using a suitable fabrication process. For example, in one particular embodiment, the back side 68 is cleaned and repaired using a reactive ion etching (RIE) process and oxidation processes, if needed.

Figure 2E:
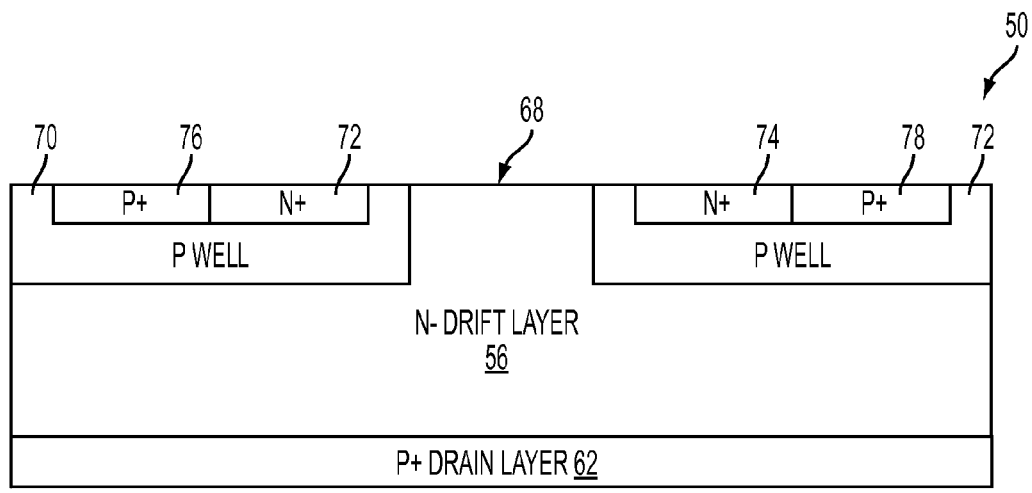

Referring back to FIG. 1, once the semiconductor substrate 52 has been removed from the semiconductor device 50, the fabrication of the semiconductor device 50 is completed in process step 20. For example, in embodiments wherein the semiconductor device 50 is a DMOS insulated-gate bipolar transistor, the process step 20 includes a sub-step 22 wherein doped "P" wells or base regions 70, 72 are formed in the back side 68 of the drift semiconductor layer 56. It should be appreciated that although only two doped wells are illustrated in FIG. 2e, any number of doped wells may be formed so as to facilitate the fabrication of any number of semiconductor devices. The doped "P" wells 70, 72 are doped with P-type impurities. In process step 24, the source regions 72, 74 and base contact regions 76, 78 are formed in the doped wells 70, 72, respectively. The source regions 72, 74 are doped with an N-type impurity to an "N+" concentration. The base contact regions 76, 78 are doped with a P-type impurity to a "P+" concentration.

Figure 2F:
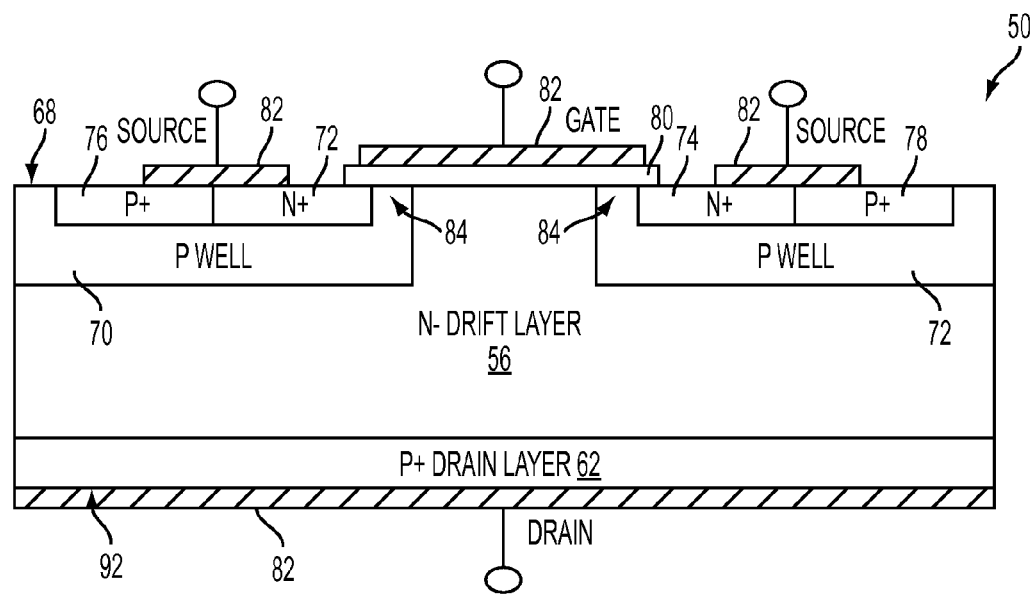

Once the source regions 72, 74 and the base contact regions 76, 78 have been formed in the wells 70, 72, the gate, source, and drain electrodes of the semiconductor device 50 are formed in process step 26. To do so, as illustrated in FIG. 2f, a gate dielectric layer 80, such as an oxide layer, is formed on the back side 68 of the drift semiconductor layer 56. A gate electrode 82 subsequently formed on the gate dielectric layer 80. The gate electrode 82 is formed so as to cover the channel regions 84 of the semiconductor device 50. Source electrodes 86, 88 are formed over the source regions 72, 74, respectively. Similarly, a drain electrode 90 is formed on a front side 92 of the drain semiconductor layer 52.

Figure 3:
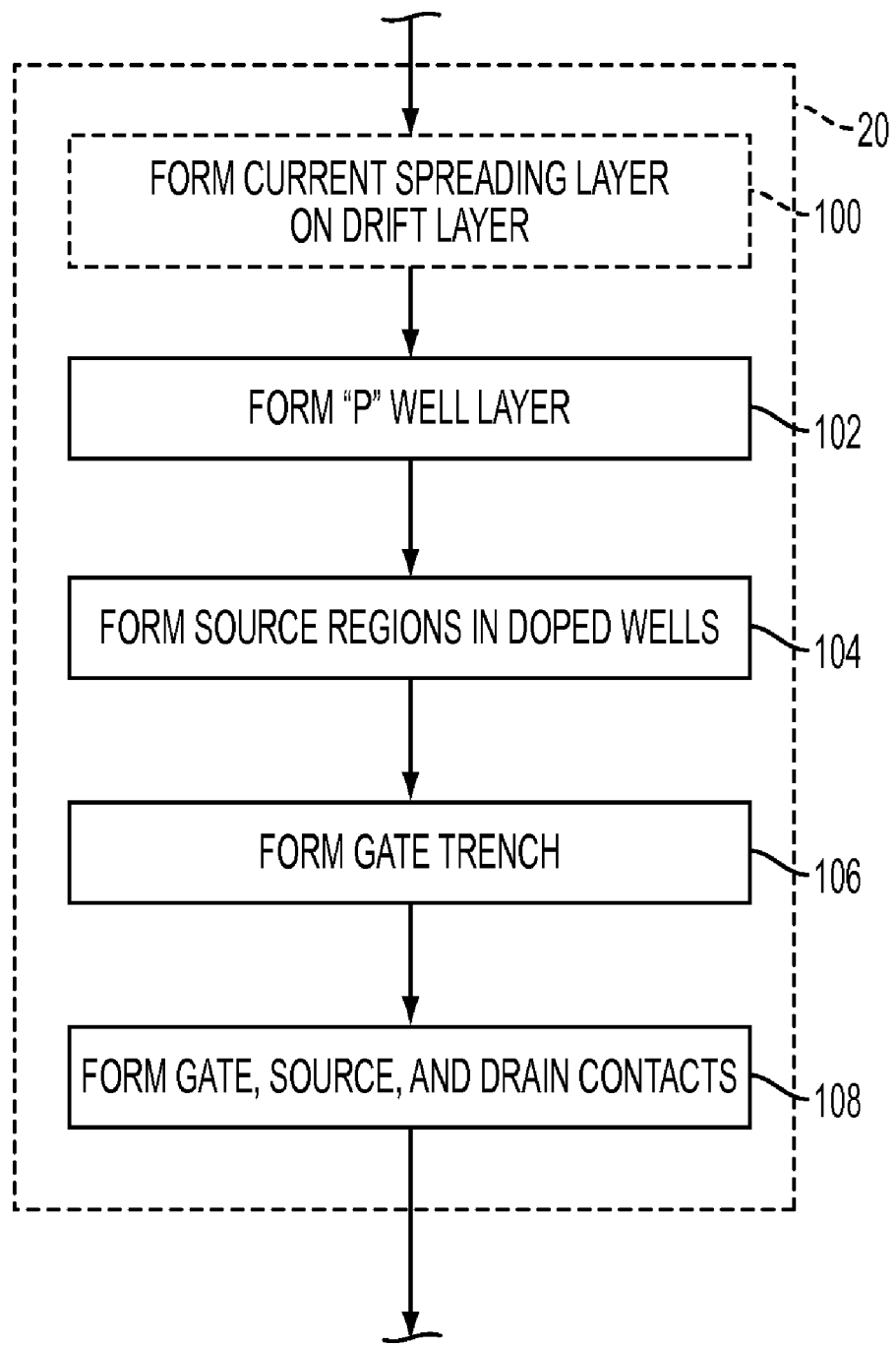
FIG. 3 is a flowchart of another embodiment of a sub-process of the algorithm for fabricating a semiconductor device of FIG. 1.
Figure 4A:
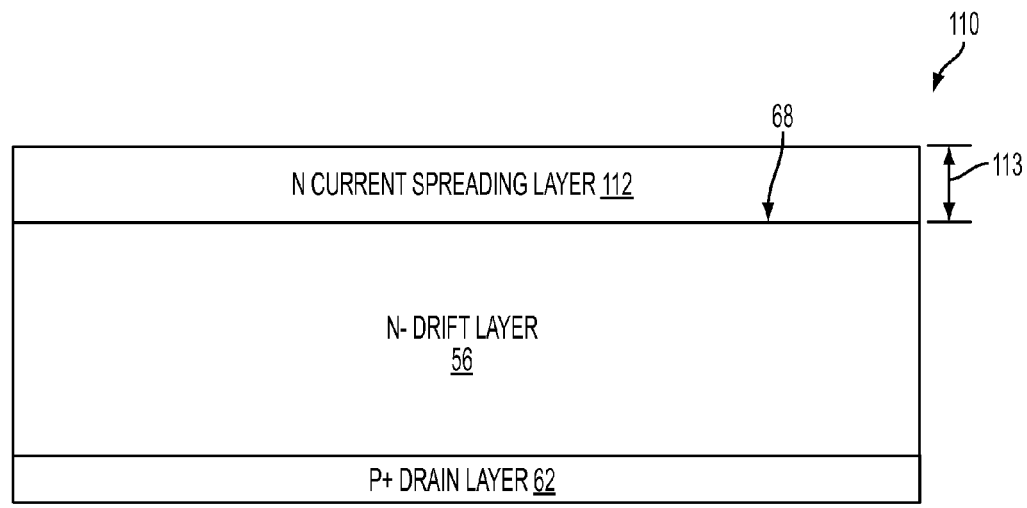
FIGS. 4a-4e are fragmentary, cross-sectional views of one embodiment of a semiconductor device at different stages of fabrication according to the algorithm of FIGS. 1 and 3.

Although the illustrative semiconductor device 50 is a DMOS insulated gate bipolar transistor, it should be appreciated that the algorithm 10 may be used to fabricate other types of semiconductor devices such as, for example, a UMOS insulated gate bipolar transistor. To do so, the process steps 12-18 of algorithm 10 are performed in the manner described above in regard to each respective step to produce a semiconductor device similar to the semiconductor device illustrated in FIG. 2d. However, to fabricate a UMOS insulated gate bipolar transistor using the algorithm 10, additional sub-steps are executed in process step 20 as illustrated in FIG. 3. As shown in FIG. 4a, to fabricate a UMOS insulated gate bipolar transistor, in some embodiments, the process step 20 begins with a sub-step 100 in which a current spreading semiconductor layer 112 is formed on the back side 68 of the drift semiconductor layer 56. In the illustrative embodiment, the current spreading semiconductor layer 112 is formed on the back side 68 of the drift semiconductor layer by epitaxially growing (e.g., via chemical vapor deposition) the current spreading layer 112 to a thickness 113. The current spreading layer 112 is illustratively formed from silicon-carbide and is doped with N-type impurities to an "N" concentration. The current spreading layer 112 may be so doped during the formation of the layer 20 or subsequently thereafter using any suitable doping technique such as, for example, an ion implantation or diffusion process. The current spreading layer 112 is doped to an N-type impurity concentration that is greater than the concentration of the N-type impurities of the drift layer 56.

Figure 4B:
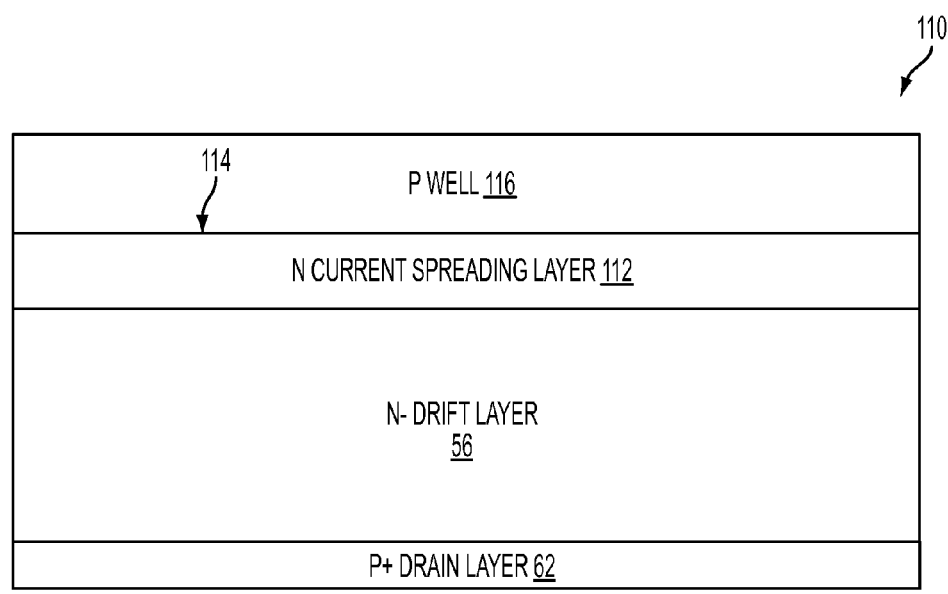
Figure 4C:
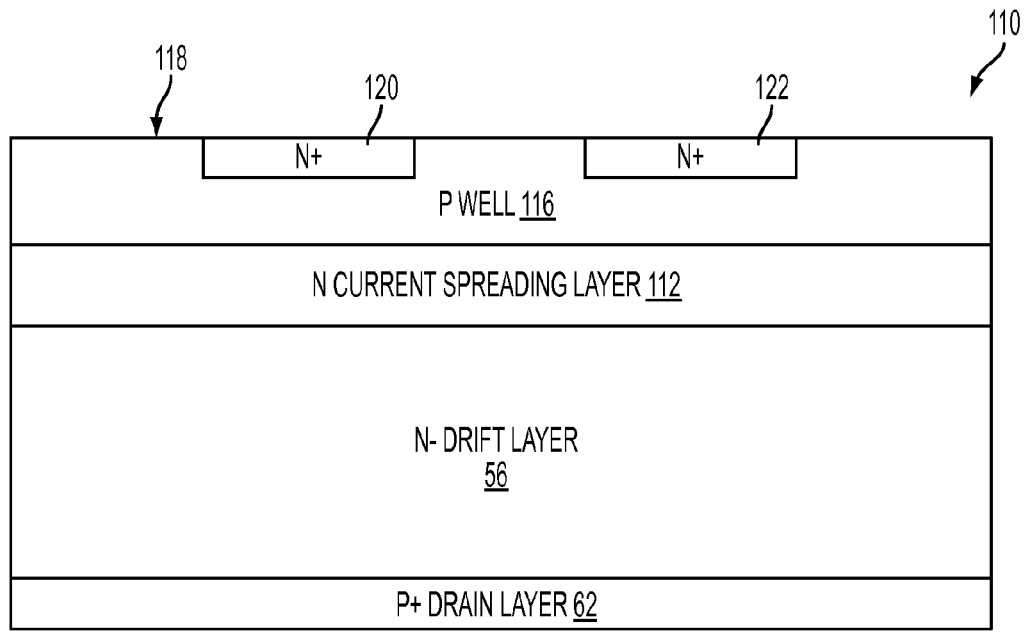

Referring back to FIG. 3, once the current spreading layer 112 has been formed in sub-step 100, a "P" well semiconductor layer or base region 116 is formed on the current spreading layer 112 in process step 102. As illustrated in FIG. 4b, the "P" well semiconductor layer 116 is formed on a front side 114 of the current spreading layer. As discussed above, if the current spreading layer 112 is formed from a silicon-carbide material, the "P" well semiconductor layer 116 may be formed on either the silicon side or the carbon side of the current spreading layer 112. The "P" well semiconductor layer 116 may be formed by epitaxially growing the layer 116 on the current spreading layer 112 or, alternatively, the current spreading layer 112 may be formed to have an increased thickness 113 and the "P" well semiconductor layer or base region 116 may be formed by incorporating P-type impurities into the upper region of the current spreading layer 112 by, for example, ion implantation.

Figure 4D:
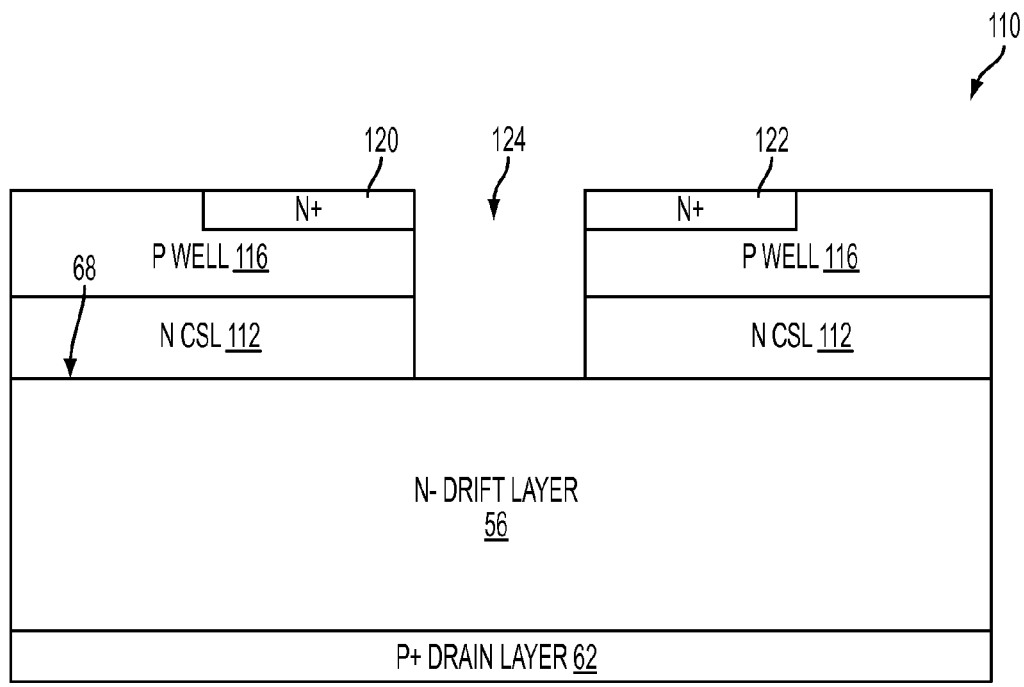

Referring back to FIG. 3, once the "P" well layer 116 has been formed, a first source region 120 and a second source region 122 are formed in the "P" well semiconductor layer 116. The source regions 120, 122 are illustratively doped with N-type impurities to an "N+" concentration. The source regions 120, 122 may be formed in the "P" well semiconductor layer by, for example, an ion implantation process. Once the source regions 120, 122 have been so formed, a gate trench 124 is formed in the semiconductor device 110 in process step 106. As illustrated in FIG. 4d, the gate trench 124 is formed between the source regions 120, 122. It should be appreciated that, in some embodiments, the source regions 120, 122 may be initially formed in sub-step 104 as a single, long source region. Subsequently, in sub-step 106, the gate trench 124 is formed such that the single, long source region is divided into the source regions 120, 122. Alternatively, in some embodiments, the source regions 102, 122 may be formed subsequent to the gate trench 124. Regardless, the gate trench 124 is etched down to the bottom side 68 of the drift layer 56.

Figure 4E:
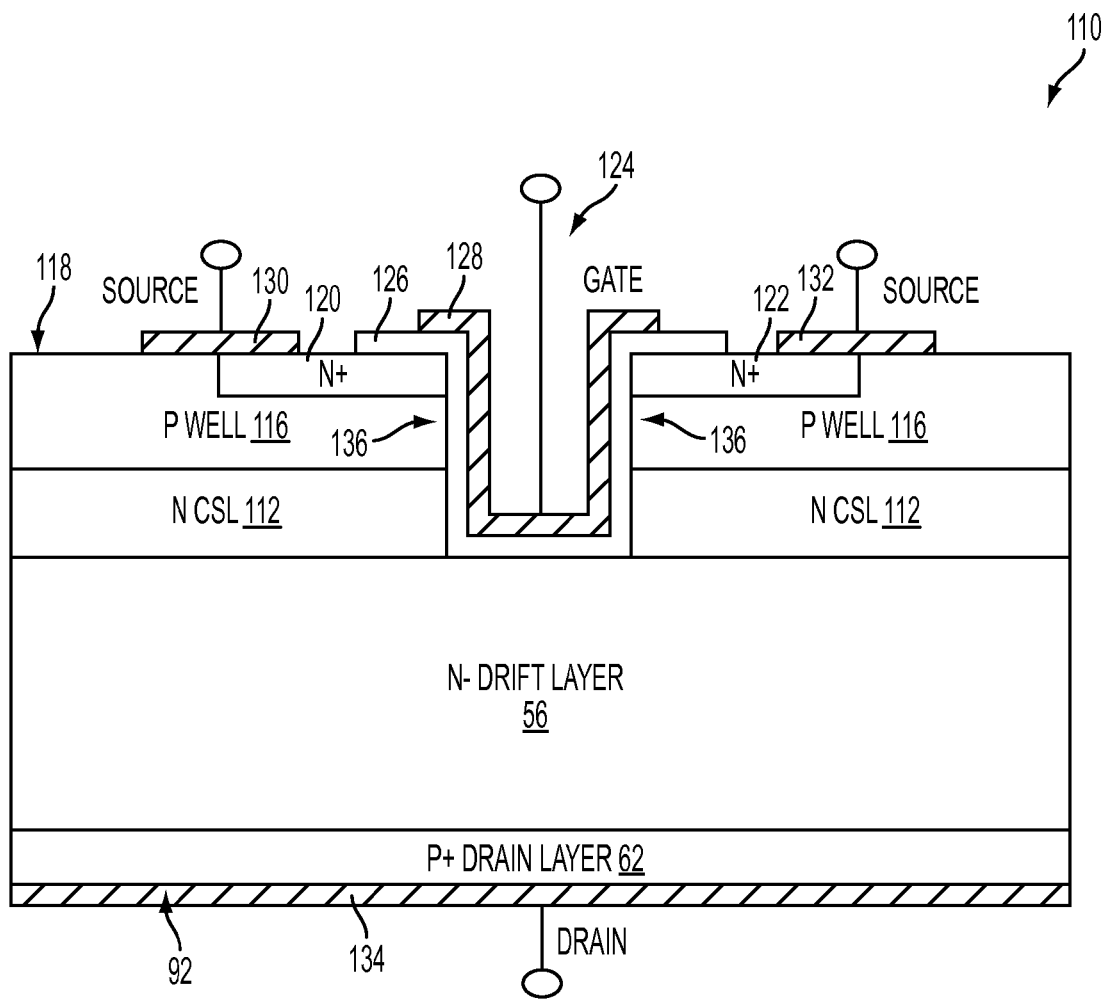

Referring back to FIG. 3, once the gate trench 124 has been formed in process step 106, the electrodes of the semiconductor device 110 are formed in process step 108. As illustrated in FIG. 4e, a gate dielectric layer 126, such are an oxide layer, is formed in the gate trench 124. A gate electrode 128 is subsequently formed on the gate dielectric layer 126 such that the gate electrode is formed over the channel regions 136 of the semiconductor device 110. Source electrodes 130, 132 are formed over the source regions 120, 122, respectively. Similarly, a drain electrode 134 is formed on a front side 92 of the drain semiconductor layer 52.

It should be appreciated that although the algorithm 10 has been described herein in reference to a DMOS insulated-gate bipolar transistor and a UMOS insulated-gate bipolar transistor, the algorithm 10 may be used to form other types of high power semiconductor devices. For example, the algorithm 10 may be used to form a thyristor by the additional of appropriate semiconductor layers. As such, the algorithms disclosed herein are not limited to the fabrication of insulated-gate bipolar transistors, but instead may be used to fabricate other semiconductor devices for use in high power applications.

Figure 5:
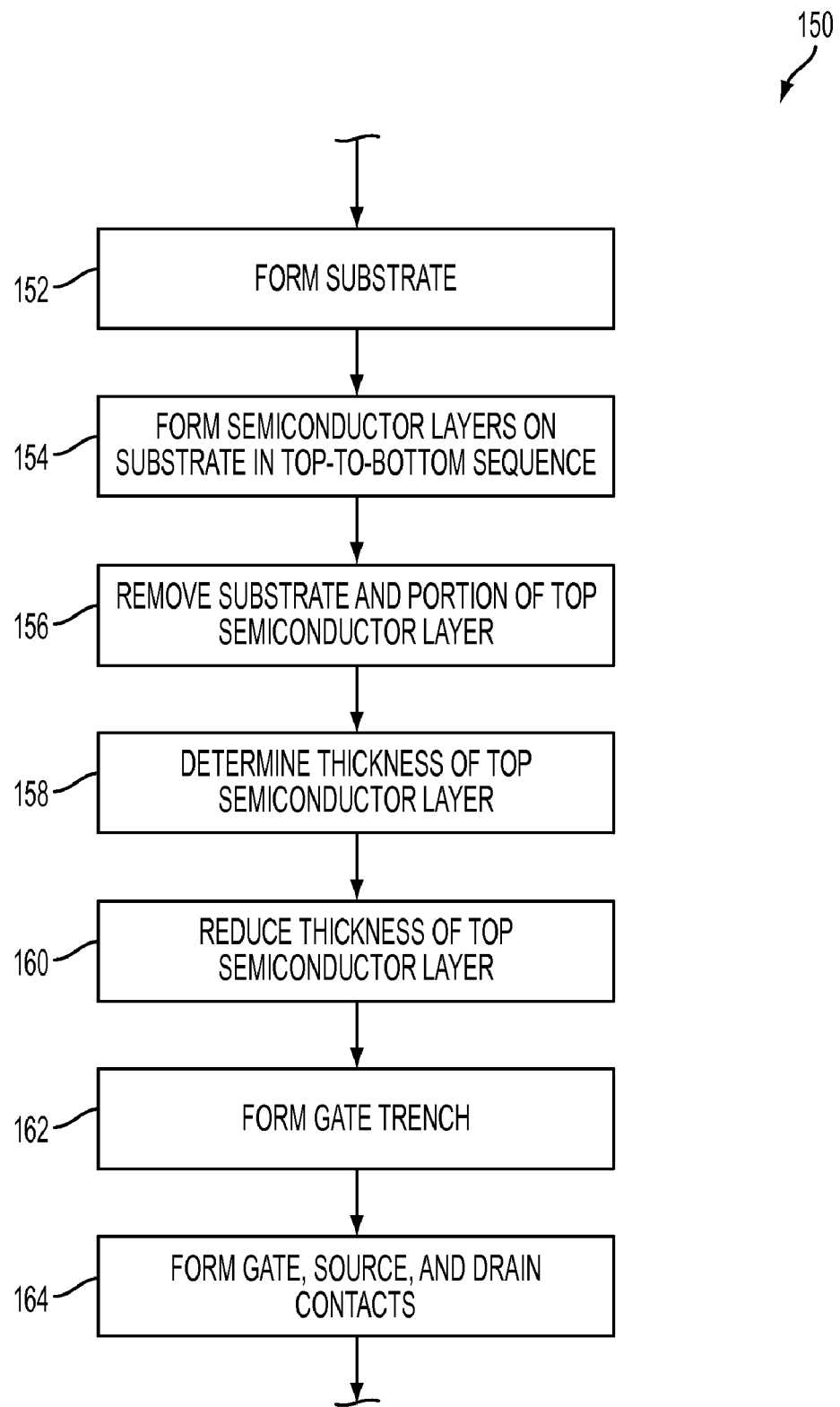
FIG. 5 is a flowchart of another embodiment of an algorithm for fabricating a semiconductor device.
Figure 7:
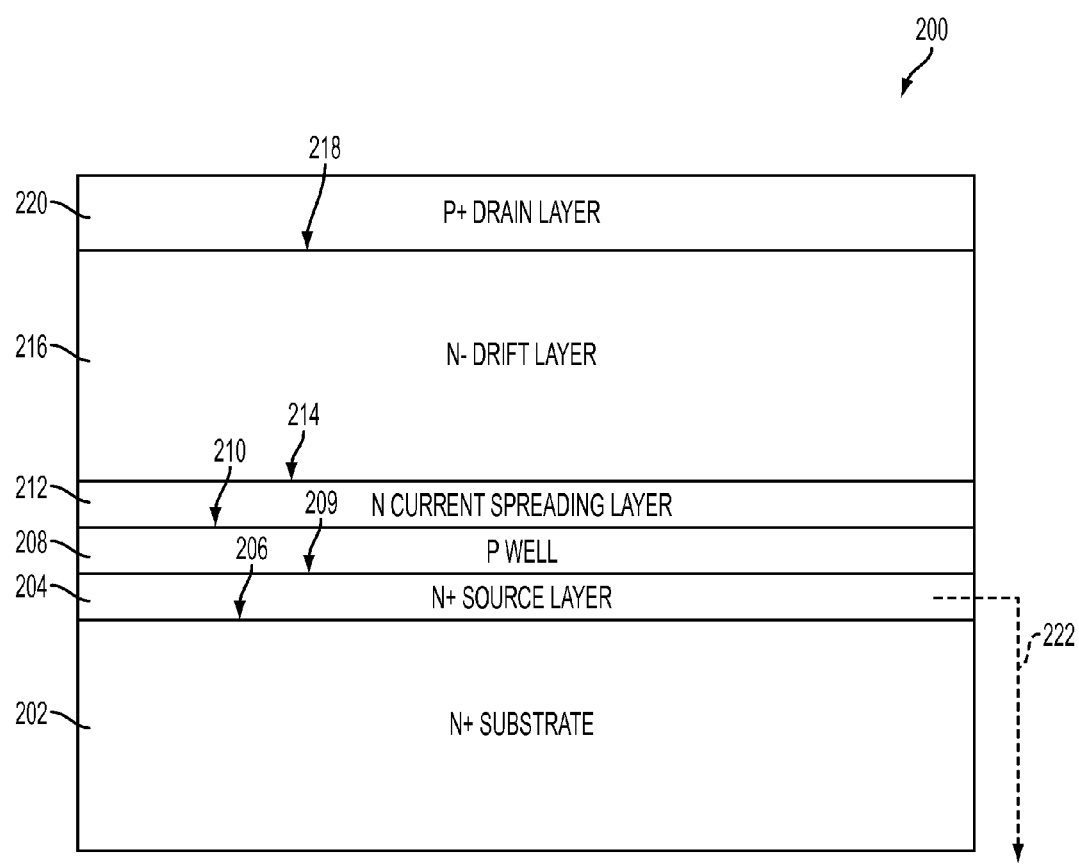
FIG. 7 is a fragmentary, cross-sectional view of one embodiment of a semiconductor device fabricated using the algorithm of FIG. 5.

Referring now to FIG. 5, in another embodiment, an algorithm 150 for fabricating a semiconductor device, such as an insulated-gate bipolar transistor device, begins with a process step 152. In process step 152, a semiconductor substrate 202 is formed as shown in FIG. 7. Process step 152 is substantially similar to the process step 12 of algorithm 10 and the semiconductor substrate 202 may be substantially similar to the semiconductor substrate 52 formed in process step 12. For example, the semiconductor substrate may be formed from silicon-carbide. It should be appreciated that because the substrates 52, 202 are subsequently removed during the fabrication of the semiconductor devices 50, 200, the substrates 52, 202 may be doped with any type of impurity. For example, the semiconductor 202 may be doped with N-type impurities to an "N+" concentration or with P-type impurities to a "P+" concentration.

Subsequently, in process step 154, additional semiconductor layers are formed on a front side 206 of the semiconductor substrate 202. As illustrated in FIG. 7, the semiconductor layers are formed in a top-to-bottom sequence. That is, the semiconductor layer that will be the top-most semiconductor layer when the semiconductor device is complete is formed first on the front side 206 of the substrate 202. For example, in embodiments wherein the semiconductor device 200 is a UMOS insulated-gate bipolar transistor, an "N+" source semiconductor layer 204 is formed on the front side 206 of the semiconductor substrate 202. In embodiments wherein the semiconductor device 200 is a DMOS insulated-gate bipolar transistor, an "N−" drift layer may be formed on the front side 206 of the substrate 202 instead. As such, it should be appreciated that the algorithm 150 may be used to fabricate a number of different semiconductor devices including, but not limited to, UMOS IGBTs, DMOS IGBTs, and thyristors. Algorithm 150 will be described below in regard to the fabrication of a UMOS insulated-gate bipolar transistor with the understanding that the description is applicable to other types of semiconductor devices with minor changes such as the type of implants or semiconductor layers fabricated.

A "P" well semiconductor layer or anode layer 208 is subsequently formed on a back side 209 of the source layer 204. A current spreading semiconductor layer 212 may, in some embodiments, then be formed on a back side 210 of the "P" well layer 204. Subsequently, an "N−" drift layer 216 is subsequently formed on a back side 214 of the current spreading layer 212 and a "P+" drain semiconductor layer 220 is formed on a back side 218 of the drifty layer 216. It should be appreciated that one or more of the semiconductor layers 204, 208, 212, 216, 220 may be formed via epitaxially growing the semiconductor layers 204, 208, 212, 216, 220 or forming the semiconductor layers 204, 208, 212, 216, 220 in an underlying layer via, for example, an ion implantation process or a diffusion process. As illustrated in FIG. 7, the semiconductor layers 204, 208, 212, 216, 220 are formed on the semiconductor substrate 202 in reverse order. That is, once the fabrication of the semiconductor device 200 is completed, the source layer 204 will be the top-most semiconductor layer.

In embodiments wherein the semiconductor layers 204, 208, 212, 216, 220 are sequentially epitaxially grown on the substrate 202, the probability of the occurrence of lattice damage in the semiconductor device 200 may be reduced. Lattice damage to the crystal structure of the semiconductor device 200 may occur during, for example, ion implantation, interrupted epitaxial growth of semiconductor layers (i.e., wherein the semiconductor device 200 is moved from one fabrication reactor to another fabrication reactor during the fabrication processes), and the like.

Referring back to FIG. 5, once the semiconductor layers 204, 208, 212, 216, 220 have been formed in process step 154, the semiconductor substrate and a portion of the source layer 204 are removed in process step 156. For example, as illustrated in FIG. 7, the "N+" semiconductor substrate 202 and a portion of the "N+" source semiconductor layer 204 may be removed as illustrated by the arrow 222. The substrate 202 and the source layer 204 may be removed by use of, for example, a chemical mechanical polish process. However, because the source layer 204 is relatively thin (e.g., about 10 to about 20 micrometers), it may be difficult to determine the precise amount of thickness removed from the source layer 204. Accordingly, as illustrated in FIG. 5, in process step 158, the thickness of the top semiconductor layer is determined. Note that after the substrate is removed in process step 156, the source layer 204 is the top-most semiconductor layer of the semiconductor device 200 (i.e., the "P+" drain layer 220 is the bottom-most semiconductor layer).

Figure 6:
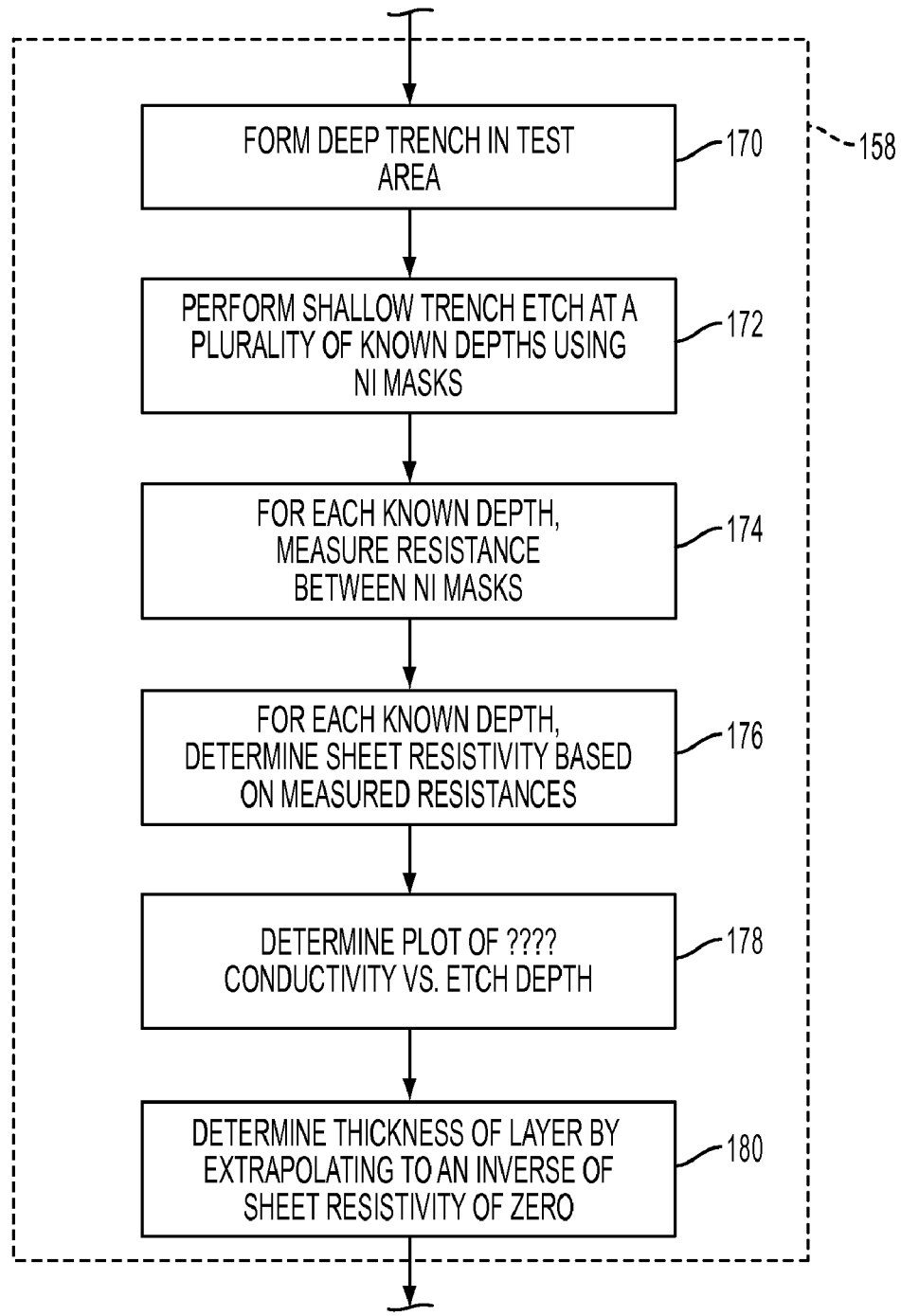
FIG. 6 is a flowchart of one embodiment of an algorithm for determining a thickness of a semiconductor layer used in the algorithm of FIG. 5.
Figure 8A:
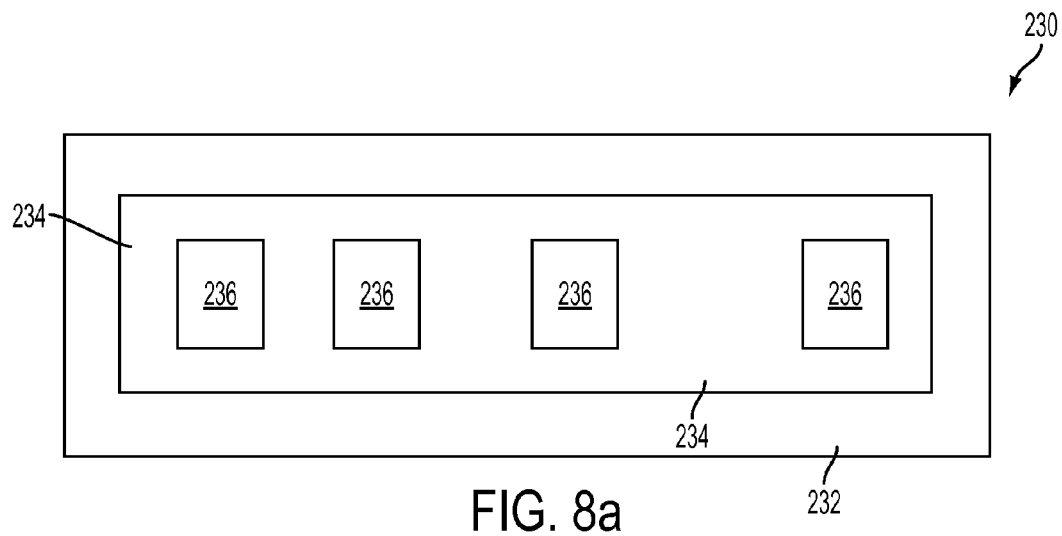
FIGS. 8a-8b are views of a test area created during the execution of the algorithm of FIG. 6.
Figure 8B:
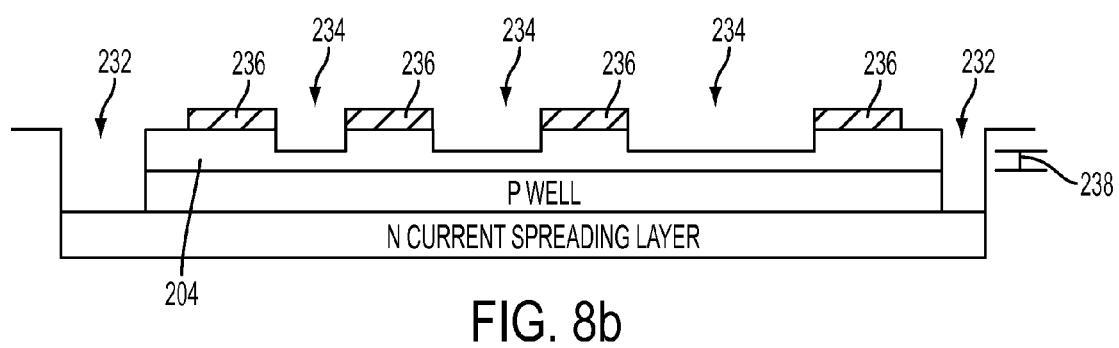
Figure 9:
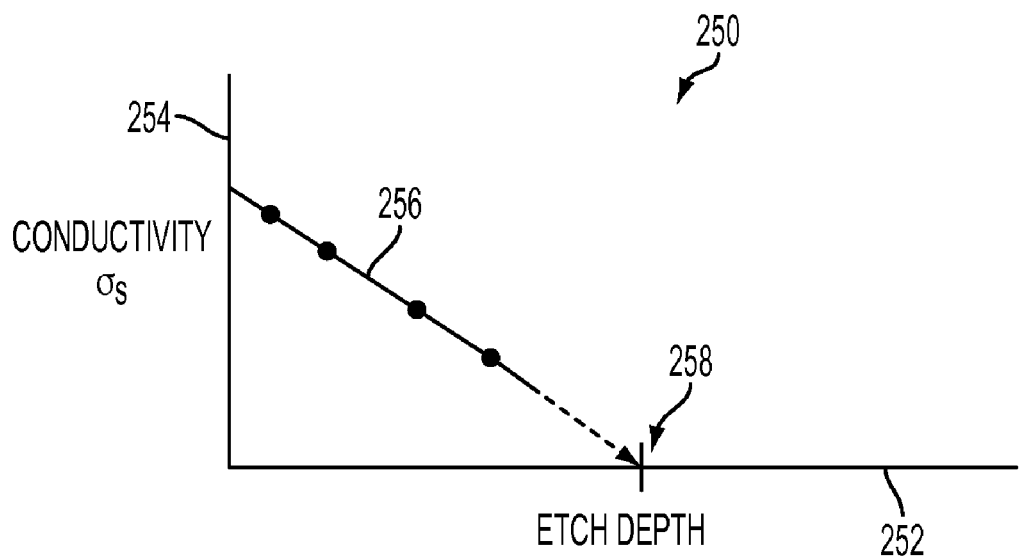
FIG. 9 is a graph showing a theoretical relationship between the conductivity and etching depth of a semiconductor wafer used in the algorithm of FIG. 6.

To do so, a trench length method measure-and-etch sequence may be performed. For example, as illustrated in FIG. 6, the process step 156 may include a first sub-step 170 in which a deep trench 232 is formed in a test area 230 of the semiconductor wafer upon which the semiconductor device 200 is being formed. As illustrated in FIG. 8a, the deep trench 232 may delineate the test area 230. As illustrated in FIG. 8b, the deep trench 232 is illustratively etched to the depth of the current spreading layer 212. Subsequently, in sub-step 172, a shallow trench 234 is etch in the test area 230 to a plurality of known depths using a number of conductive mask 236 such as, for example, a nickel (Ni) material. As such, the conductive masks 236 are separated by varying distances of the source layer 204. Once the shallow trenches 234 have been formed, the sheet resistivity between each conductive mask 236 is determined in process step 176. Subsequently, in process step 178, a plot 250 may be generated of the conductivity (i.e., the inverse of the sheet resistivity) of the source layer 204 versus the etching depths of the shallow trenches 234. The plot 250 has an abscissa axis 252 graduated in units of known etching depth of the shallow trenches 232 between the conductive masks 236 and an ordinate axis 254 graduated in units of conductivity between the conductive masks 236. A plot line 256 is generated based on the sheet resistivity measurements performed in process step 176. The thickness 238 of the source layer 204 may then be determined by extrapolating the plot line 256 to the point at which the conductivity reaches a value of zero (i.e., the point 258 at which the plot line 256 intercepts the abscissa axis 252).

Referring back to FIG. 5, once the thickness 238 of the source layer 204 has been determined in process step 158, the thickness of the source layer 204 is reduced to a known thickness in process step 160. In the illustrative embodiment, the source layer 204 is etched to a thickness of about two to about three micro meters. The source layer 204 may be so etched using any suitable etching process such as, for example, a reaction ion etch process. Because the thickness 238 of the source layer 204 is known prior to the etching step, the source layer 204 may be selectively etched to a known thickness using such etching processes.

Once the source layer 204 has been etched to the desired thickness in process step 160, the fabrication of the semiconductor device 200 is completed in process steps 162 and 164. Because the illustrative semiconductor device 200 is a UMOS insulated-gate bipolar transistor, in process step 162 a gate trench is formed in the source layer 204, the "P" well layer 208, and the current spreading layer 212. The process step 162 may be substantially similar to the sub-step 106 of process step 20 of algorithm 10 described above in regard to FIG. 3. Subsequently, in process step 164, the gate dielectric, gate electrode, source electrodes, and drain electrode are formed on the semiconductor device 200 in process step 164. Again, the process step 164 may be substantially similar to sub-step 108 of process step 20 of algorithm 10 described above in regard to FIG. 3. As such, the semiconductor 200, once fabricated, may be substantially similar to the semiconductor device 110 illustrated in and described above in regard to FIG. 4d.

Figure 10:
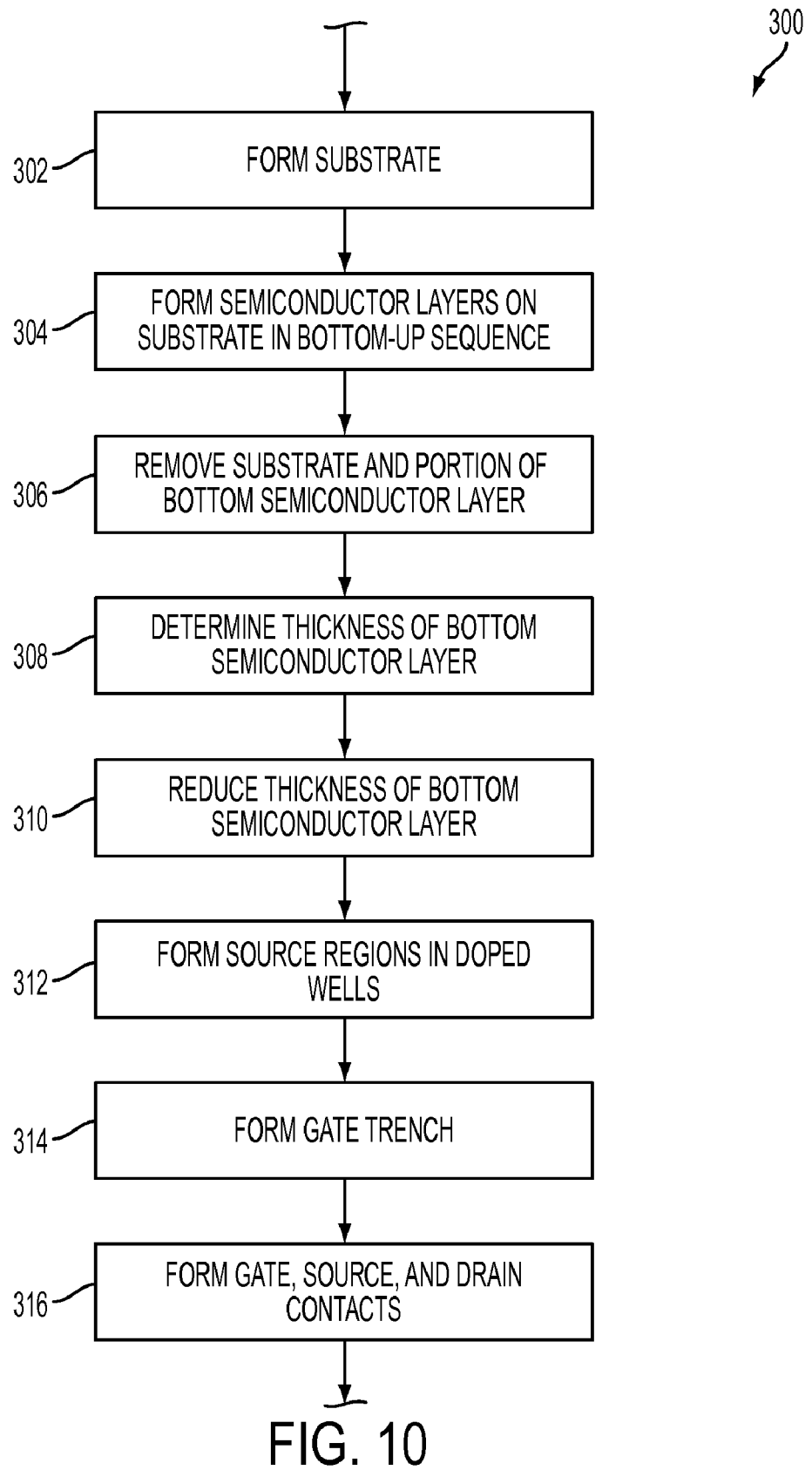
FIG. 10 is a flowchart of another embodiment of an algorithm for fabricating a semiconductor device.
Figure 11:
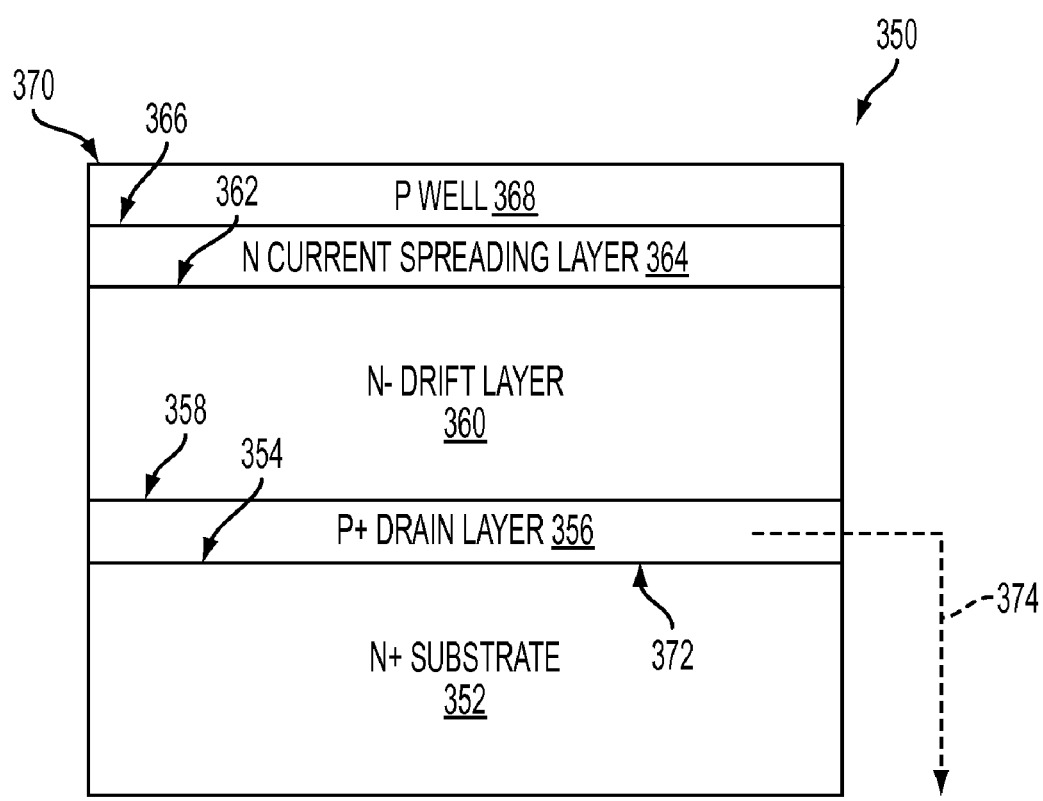
FIG. 11 is a fragmentary, cross-sectional view of one embodiment of a semiconductor device fabricated using the algorithm of FIG. 10.

Referring now to FIG. 10, in another embodiment, an algorithm 300 for fabricating a semiconductor device 350, such as an insulated-gate bipolar transistor device, begins with a process step 302. In process step 302, a semiconductor substrate 352 is formed as illustrated in FIG. 11. Process step 352 is substantially similar to the process step 12 of algorithm 12 and the semiconductor substrate 352 may be substantially similar to the semiconductor substrate 52 formed in process step 12. For example, the semiconductor substrate 352 may be formed from silicon-carbide. It should be appreciated that because the substrates 52, 352 are subsequently removed during the fabrication of the semiconductor devices 50, 350, the substrates 52, 352 may be doped with any type of impurity. For example, the semiconductor 202 may be doped with N-type impurities to an "N+" concentration or with P-type impurities to a "P+" concentration.

Subsequently, in process step 304, additional semiconductor layers are formed on a front side 354 of the semiconductor substrate 352. As illustrated in FIG. 11, the semiconductor layers are formed in a bottom-to-top sequence. That is, the semiconductor layer that will be the bottom-most semiconductor layer when the semiconductor device 350 is completed is formed first on the front side 354 of the substrate 352. For example, in embodiments wherein the semiconductor device 350 is a UMOS insulated-gate bipolar transistor, a "P+" drain semiconductor layer or anode layer 356 is formed on the front side 354 of the semiconductor substrate 352. Similarly, in embodiments wherein the semiconductor device 350 is a DMOS insulated-gate bipolar transistor, a "P+" drain semiconductor layer or anode layer is formed on the front side 354 of the semiconductor substrate 352. A "N−" drift semiconductor layer 360 is then formed on a front side 358 of the drain layer 356. Subsequently, in some embodiments, a current spreading semiconductor layer 364 may be formed on a front side 362 of the drift layer 360 and a "P" well semiconductor layer or base region 368 is formed on a front side 366 of the current spreading layer 364. It should be appreciated that one or more of the semiconductor layers 352, 356, 360, 364, 368 may be formed via epitaxially growing the semiconductor layers 352, 356, 360, 364, 368 or forming the semiconductor layers 352, 356, 360, 364, 368 in an underlying layer via, for example, an ion implantation process or a diffusion process. As illustrated in FIG. 11, the semiconductor layers 352, 356, 360, 364, 368 are formed on the semiconductor substrate 202 in sequential order. That is, once the fabrication of the semiconductor device 200 is completed, the "P" well layer 368 will be the top-most semiconductor layer. In embodiments wherein the semiconductor layers 352, 356, 360, 364, 368 are sequentially epitaxially grown on the substrate 352, the probability of the occurrence of lattice damage in the semiconductor device 200 may be reduced. However, because Referring back to FIG. 10, once the semiconductor layers 352, 356, 360, 364, 368 have been formed in process step 304, the semiconductor substrate 352 and a portion of the drain layer 356 are removed in process step 306. For example, as illustrated in FIG. 1, the "N+" semiconductor substrate 352 and a portion of the "P+" drain semiconductor layer 356 may be removed as illustrated by the arrow 374. The substrate 352 and the drain layer 356 may be removed by use of, for example, a chemical mechanical polish process. However, similar to the source layer 204 of the semiconductor device 200 of FIG. 7, because the drain layer 356 is relatively thin (e.g., about 10 to about 20 micrometers), it may be difficult to determine the precise amount of thickness removed from the drain layer 356 during the etching process. Accordingly, in process step 158, the thickness of the bottom semiconductor layer (i.e., the drain layer 356) is determined. Note that after the substrate is removed in process step 306, the drain layer 356 is the bottom-most semiconductor layer of the semiconductor device 350 (i.e., the "P" well layer 368 is the top-most semiconductor layer of the semiconductor device 350).

To do so, a trench length method measure-and-etch sequence may be performed. The trench length method measure-and-etch sequence is substantially similar to the trench length method measure-and-etch sequence performed in and discussed above in regard to the algorithm 158 of FIG. 6. Once the thickness of the drain layer 356 has been determined in process step 308, the thickness of the drain layer 356 is reduced to a known thickness in process step 310. In the illustrative embodiment, the drain layer 204 is etched to a thickness of about two to about three micrometers. The drain layer 356 may be so etched using any suitable etching process such as, for example, a reaction ion etch process. Because the thickness of the drain layer 356 is known prior to the etching step, the drain layer 356 may be selectively etched to a known thickness using such etching processes.

Once the drain layer 356 has been etched to the desired thickness in process step 310, the fabrication of the semiconductor device 350 is completed in process steps 312, 314, and 316. In process step 312, "N+" source regions are implanted in the "P" well layer 368. The "N+" source regions may be so implanted by, for example, an ion implantation process. Because the illustrative semiconductor device 350 is a UMOS insulated-gate bipolar transistor, in process step 314 a gate trench is formed in the "P" well layer 208 and the current spreading layer 212. The process step 314 is substantially similar to the sub-step 106 of process step 20 of algorithm 10 described above in regard to FIG. 3. Subsequently, in process step 316, the gate oxide, gate electrode, source electrodes, and drain electrode are formed on the semiconductor device 350. Again, the process step 350 is substantially similar to sub-step 108 of process step 20 of algorithm 10 described above in regard to FIG. 3. As such, the semiconductor 200 once fabricated is substantially similar to the semiconductor device 110 illustrated in and described above in regard to FIG. 4d.

Again, it should be appreciated that the algorithm 300 may be used to fabricate a number of different semiconductor devices including, but not limited to, UMOS IGBTs, DMOS IGBTs, and thyristors. Although algorithm 300 has been described above in regard to a UMOS IGBT, it should be appreciated that the algorithm 300 may be used, with slight modification, to fabricate other types of high power semiconductor devices. As such, the algorithm 300 is not limited to the fabrication of UMOS insulated-gate bipolar transistors.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the methods and semiconductor devices described herein. It will be noted that alternative embodiments of the methods and semiconductor devices of the present disclosure may not include all of the features described yet still benefit from at least some of the advantages of such features. Those of ordinary skill in the art may readily devise their own implementations of the methods and semiconductor devices that incorporate one or more of the features of the present invention and fall within the spirit and scope of the present disclosure as defined by the appended claims.

The invention claimed is:

1. A method for fabricating a semiconductor device, the method comprising:
   forming a silicon-carbide substrate;
   epitaxially growing a first semiconductor layer on a front side of the silicon-carbide substrate such that the first semiconductor layer is lattice-matched to the silicon-carbide substrate; and
   removing the entire silicon-carbide substrate after the formation of the first semiconductor layer,
   wherein the first semiconductor layer is a drift semiconductor layer of the semiconductor device having a first concentration of first type impurities that is less than a second concentration of first type impurities of the silicon-carbide substrate.

2. The method of claim 1, wherein the semiconductor device is an insulated-gate bipolar transistor.

3. The method of claim 2, wherein the semiconductor device is a DMOS insulated-gate bipolar transistor.

4. The method of claim 2, wherein the semiconductor device is a UMOS insulated-gate bipolar transistor.

5. The method of claim 1, wherein epitaxially growing the first semiconductor layer on the front side of the silicon-carbide substrate comprises epitaxially growing the first semiconductor layer on a silicon side of the silicon-carbide substrate.

6. The method of claim 1, wherein epitaxially growing the first semiconductor layer on the front side of the silicon-carbide substrate comprises epitaxially growing the first semiconductor layer on a carbon side of the silicon-carbide substrate.

7. The method of claim 1, wherein the first semiconductor layer has a thickness of about one micrometer.

8. The method of claim 1, wherein removing the entire silicon-carbide substrate comprises using a chemical mechanical polishing process.

9. The method of claim 1, further comprising epitaxially growing a second semiconductor layer on a front side of the first semiconductor layer such that the second semiconductor layer is lattice-matched to the first semiconductor layer, prior to removing the entire silicon-carbide substrate.

10. The method of claim 1, further comprising epitaxially growing a second semiconductor layer on a back side of the first semiconductor layer such that the second semiconductor layer is lattice-matched to the first semiconductor layer, after removing the entire silicon-carbide substrate.

11. The method of claim 1, wherein the first semiconductor layer forms a bottom semiconductor layer of the semiconductor device after the entire silicon-carbide substrate has been removed.

12. The method of claim 1, wherein the first semiconductor layer forms a top semiconductor layer of the semiconductor device after the entire silicon-carbide substrate has been removed.

13. The method of claim 1, wherein removing the entire silicon-carbide substrate comprises removing a portion of the first semiconductor layer.

14. The method of claim 13, further comprising epitaxially growing a second semiconductor layer on a front side of the first semiconductor layer such that the second semiconductor layer is lattice-matched to the first semiconductor layer, prior to removing the entire silicon-carbide substrate and a portion of the first semiconductor layer.

15. The method of claim 13, further comprising determining a thickness of the first semiconductor layer subsequent to removing the entire silicon-carbide substrate and a portion of the first semiconductor layer.

16. The method of claim 15, wherein determining a thickness of the first semiconductor layer comprises determining a thickness of the first semiconductor layer using a trench length measure technique.

17. The method of claim 15, wherein determining a thickness of the first semiconductor layer comprises determining a thickness of the first semiconductor layer based on a sheet resistivity of the first semiconductor layer.

18. The method of claim 15, further comprising etching the first semiconductor layer to a known thickness based on the determined thickness.

* * * * *